United States Patent
Park et al.

(10) Patent No.: US 7,462,520 B2
(45) Date of Patent: Dec. 9, 2008

(54) METHODS OF FABRICATING AN IMAGE SENSOR

(75) Inventors: Won-Je Park, Gyeonggi-do (KR);
Jae-Ho Song, Gyeonggi-do (KR);
Young-Hoon Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/464,244

(22) Filed: Aug. 14, 2006

(65) Prior Publication Data

US 2007/0054434 A1    Mar. 8, 2007

(30) Foreign Application Priority Data

Sep. 8, 2005   (KR) .................... 10-2005-0083797

(51) Int. Cl.
*H01L 27/146* (2006.01)
(52) U.S. Cl. ................. 438/151; 438/155; 438/275; 438/287; 438/591; 257/E21.625
(58) Field of Classification Search ............ 438/151, 438/155, 275, 287, 591; 257/E21.625
See application file for complete search history.

(56) References Cited

U.S. PATENT DOCUMENTS

| | | | |
|---|---|---|---|
| 5,989,962 A * | 11/1999 | Holloway et al. | 438/275 |
| 6,200,834 B1 * | 3/2001 | Bronner et al. | 438/142 |
| 6,235,590 B1 * | 5/2001 | Daniel et al. | 438/275 |
| 6,821,904 B2 | 11/2004 | Pradeep et al. | |
| 2002/0025633 A1 * | 2/2002 | Matsuoka et al. | 428/275 |
| 2005/0136595 A1 * | 6/2005 | Horie | 438/257 |
| 2005/0151175 A1 * | 7/2005 | Ohkawa | 257/292 |
| 2007/0054455 A1 * | 3/2007 | Varghese et al. | 438/287 |
| 2007/0082506 A1 * | 4/2007 | Wang et al. | 438/778 |

FOREIGN PATENT DOCUMENTS

| | | | |
|---|---|---|---|
| KR | 1020040002207 A | | 1/2004 |
| KR | 1020040108488 A | | 12/2004 |
| KR | 1020050005162 A | | 1/2005 |

\* cited by examiner

*Primary Examiner*—George Fourson
(74) *Attorney, Agent, or Firm*—Myers Bigel Sibley & Sajovec PA

(57) ABSTRACT

Provided are methods of fabricating an image sensor. Embodiments of such methods can include forming a first gate insulation layer in a first region of a semiconductor substrate and a first gate electrode layer, to cover the first gate insulation layer and forming a second gate insulation layer within a nitrogen enhanced atmosphere and a second gate electrode layer in a second region of the semiconductor substrate. The methods also include patterning the first gate electrode layer and the first gate insulation layer of the first region to form a first gate pattern and patterning the second gate electrode layer and the second gate insulation layer of the second region to form a second gate pattern.

22 Claims, 11 Drawing Sheets

METHODS OF FABRICATING AN IMAGE SENSOR

CROSS-REFERENCE TO RELATED APPLICATION

This application claims priority under 35 U.S.C. §119 to copending Korean Patent Application 2005-83797, filed Sep. 8, 2005, in the Korean Intellectual Property Office, the disclosure of which is incorporated herein in its entirety by reference.

FIELD OF THE INVENTION

The present invention relates to the field of semiconductors in general and, more particularly, to methods for fabricating image sensors.

BACKGROUND

Image sensors are electronic devices configured to transform optical images into electrical signals. Types of image sensors can include complementary metal-oxide-silicon (CMOS) and charge-coupled devices (CCD), among others. A unit pixel of an image sensor is generally composed of photodiodes configured to accept light, and transistors configured to control image signals received from the photodiodes. In the photodiodes, electron-hole pairs are generated with wavelengths and intensities of red, green, and blue light. Red, green and blue light signals are generated using corresponding color filters. The output signal of a unit pixel varies as a function of the quantity of electrons induced therein. In this manner, an optical image maybe sensed.

An image sensor can be divided into two general regions. The first is a pixel region, which includes the photodiodes arranged in an array, for example. The second region is a peripheral circuit region, which can include transistors configured to drive image signals originating in the pixel region. The transistors located in the peripheral circuit region can be operable at various voltage ranges. For example, transistors located in an analog area of the peripheral circuit region are generally operable at higher voltages. These transistors generally are constructed to include thick gate insulation layers for the high threshold voltages. In contrast, transistors located in a digital area in the peripheral circuit region are generally operable at lower voltages, and have thin gate insulation layers for fast response and low threshold voltages. As such, the transistors in the peripheral circuit region are generally constructed to include a variety of gate insulation layers to accommodate the different operating voltages.

In the transistors, it is common for the thick gate insulation layer to be formed of a pure silicon oxide layer and the thin gate insulation layer to be formed of a silicon oxynitride layer, which can contribute to device reliability and protection against boron diffusion. In the process of forming the gate insulation layers with different thicknesses, nitrogen particles may diffuse through the thick gate insulation layers during the formation of the SiON layers. In the case where nitrides are generated at interfaces between the thick gate insulation layers and a silicon substrate, interface traps can form due to the dangling bonds of silicon that result from the nitrogen particles. These interface traps in the image sensor incur problems such as flickering noise and can result in image quality deterioration.

SUMMARY

Embodiments of the present invention can be viewed as providing methods for fabricating an image sensor. In this regard, one such embodiment, among others, can be summarized by the following steps: forming a first gate insulation layer in a first region of a semiconductor substrate and a first gate electrode layer, to cover the first gate insulation layer; forming a second gate insulation layer within a nitrogen enhanced atmosphere and a second gate electrode layer in a second region of the semiconductor substrate; patterning the first gate electrode layer and the first gate insulation layer of the first region to form a first gate pattern; and patterning the second gate electrode layer and the second gate insulation layer of the second region to form a second gate pattern.

Other embodiments of the present invention can be viewed as providing methods for fabricating an image sensor and summarized by the following steps: covering a first gate insulation layer, in a pixel region and a high voltage region of a semiconductor substrate, with a first gate electrode layer. The methods also includes forming a second gate electrode layer in a low voltage region of the semiconductor substrate and forming a second gate insulation layer within a nitrogen enhanced atmosphere in the low voltage region of the semiconductor substrate.

BRIEF DESCRIPTION OF THE DRAWINGS

The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
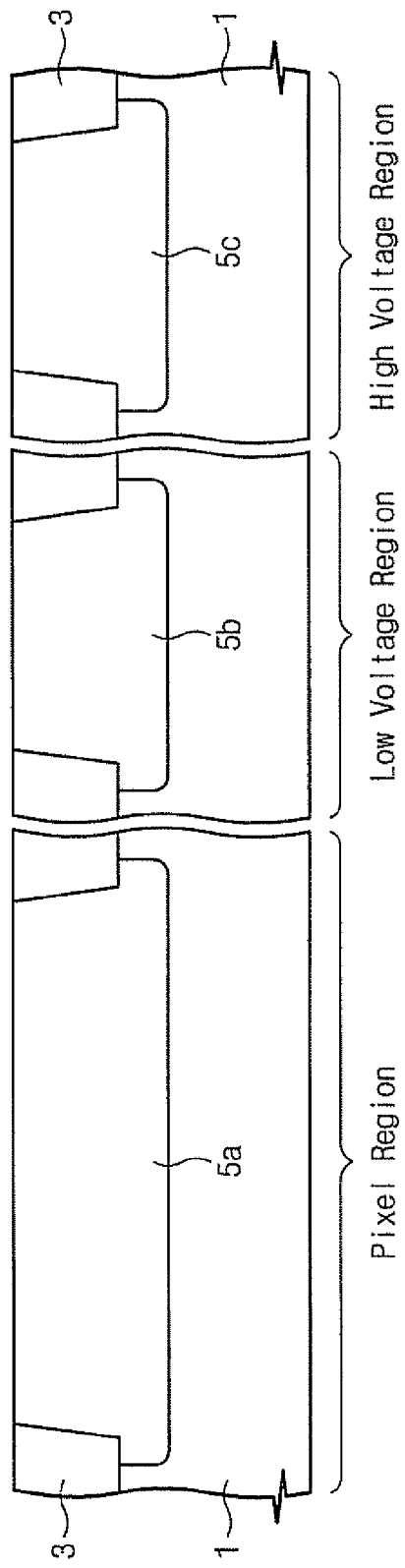
FIGS. 1-10 are sectional views that illustrate methods of fabricating an image sensor.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a">, "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

In the figures, the dimensions of structural components, including layers and regions among others, are not to scale and may be exaggerated to provide clarity of the concepts herein. It will also be understood that when a layer (or layer) is referred to as being 'on' another layer or substrate, it can be directly on the other layer or substrate, or can be separated by intervening layers. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the embodiments disclosed herein, a photodiode functions as a photoelectric converter by which signal charges are generated from light incident thereon. The embodiments disclosed herein can be adaptable to multiple types of image sensors including CMOS image sensors and CCD's, among others.

FIGS. 1 through 10, as discussed in detail below, are sectional views illustrating an exemplary embodiment of a procedure for fabricating an image sensor in accordance with the disclosure herein.

Reference is made to FIG. 1, which is a sectional view illustrating a semiconductor substrate having multiple active regions for fabricating an image sensor. The sectional view includes region isolation layers 3, which are formed to define active regions in a semiconductor substrate 1. The semiconductor substrate 1 is sectored into a pixel region, a low voltage region, and a high voltage region. The low voltage region is provided for a digital area, while the high voltage region is provided for an analog area. The region isolation layers 3 can be formed by a general process of shallow trench isolation (STI). Ionic impurities are implanted into the semiconductor substrate 1, forming well regions 5a, 5b, and 5c in the semiconductor substrate 1. This can be accomplished using, for example, photoresist patterns (not shown) as ion implantation masks. The well regions, 5a, 5b, and 5c, can be doped with impurities that are the same or can be doped differently from one another. For example, the well regions, 5a, 5b, and 5c, can be independently formed in either of P type or N type.

Figure 2:
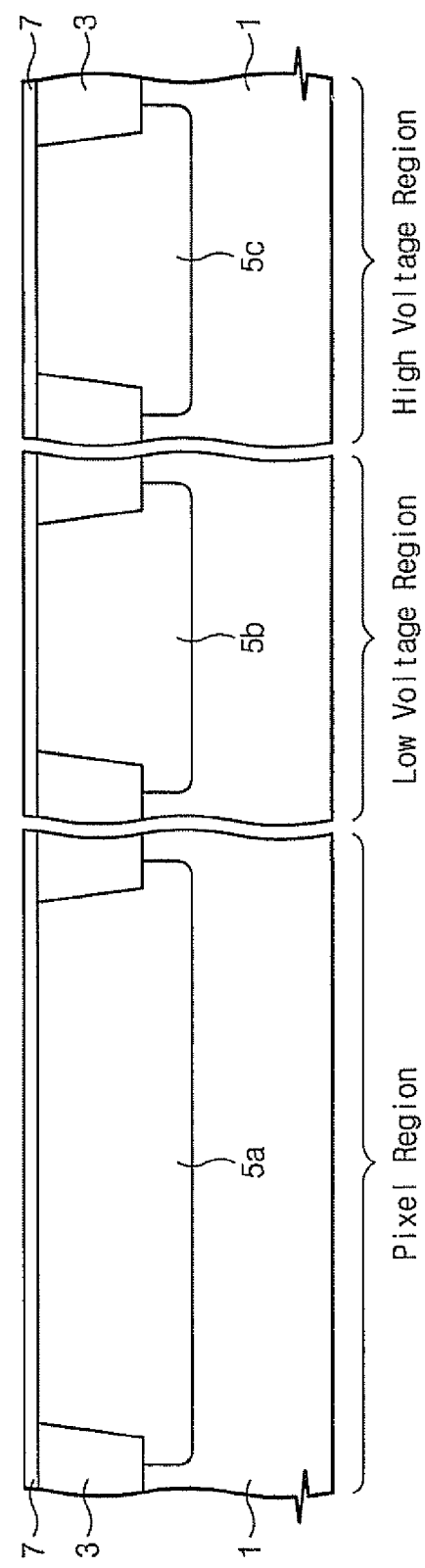

Reference is made to FIG. 2, which is the sectional view of FIG. 1, modified under a portion of embodiments of methods disclosed herein. A first gate insulation layer 7 is deposited over an entire surface of the semiconductor substrate 1. The first gate insulation layer 7 can be formed of silicon oxide ($SiO_2$). One technique, among others, for forming the first gate insulation layer includes thermal oxidation. In some embodiments, the first gate insulation layer 7 may be formed in an approximate thickness of 60□, however, other thicknesses are contemplated within the scope and spirit of this disclosure.

Figure 3:
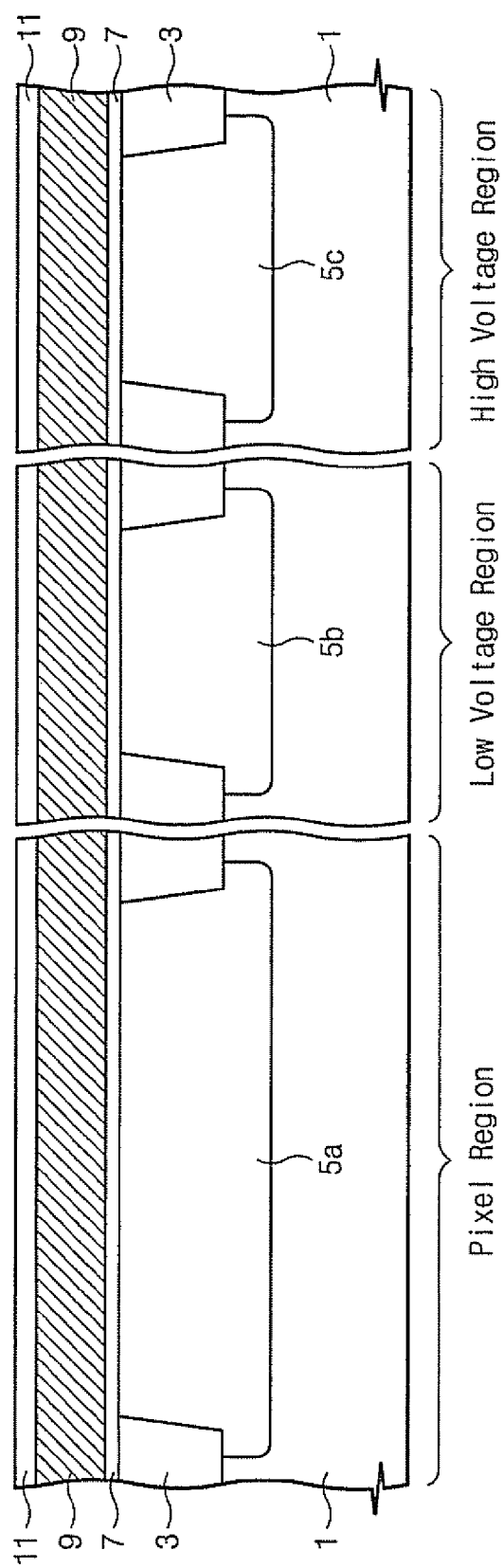

Reference is made to FIG. 3, which is the sectional view of FIG. 2, further modified under a portion of embodiments of methods disclosed herein. A first gate electrode layer 9 is deposited on the first gate insulation layer 7. The first gate electrode layer 9 can be made of polysilicon doped or undoped with impurities, tungsten silicide, tungsten nitride, or tungsten, by means of e.g., atomic layer deposition (ALD), chemical vapor deposition (CVD), or a sputtering process. A planarization stopping layer 11 is then deposited on the first gate electrode layer 9. The planarization stopping layer 11 can be formed of a material having an etching selectivity to a second gate electrode layer and a sacrificial layer that can be subsequently deposited thereon. For example, the planarization stopping layer 1 can be made of medium temperature oxide (MTO), silicon oxynitride, or silicon nitride. The planarization stopping layer 11 is formed with having sufficient thickness to function as a stopping layer against a chemical-mechanical polishing (CMP) operation.

Figure 4:
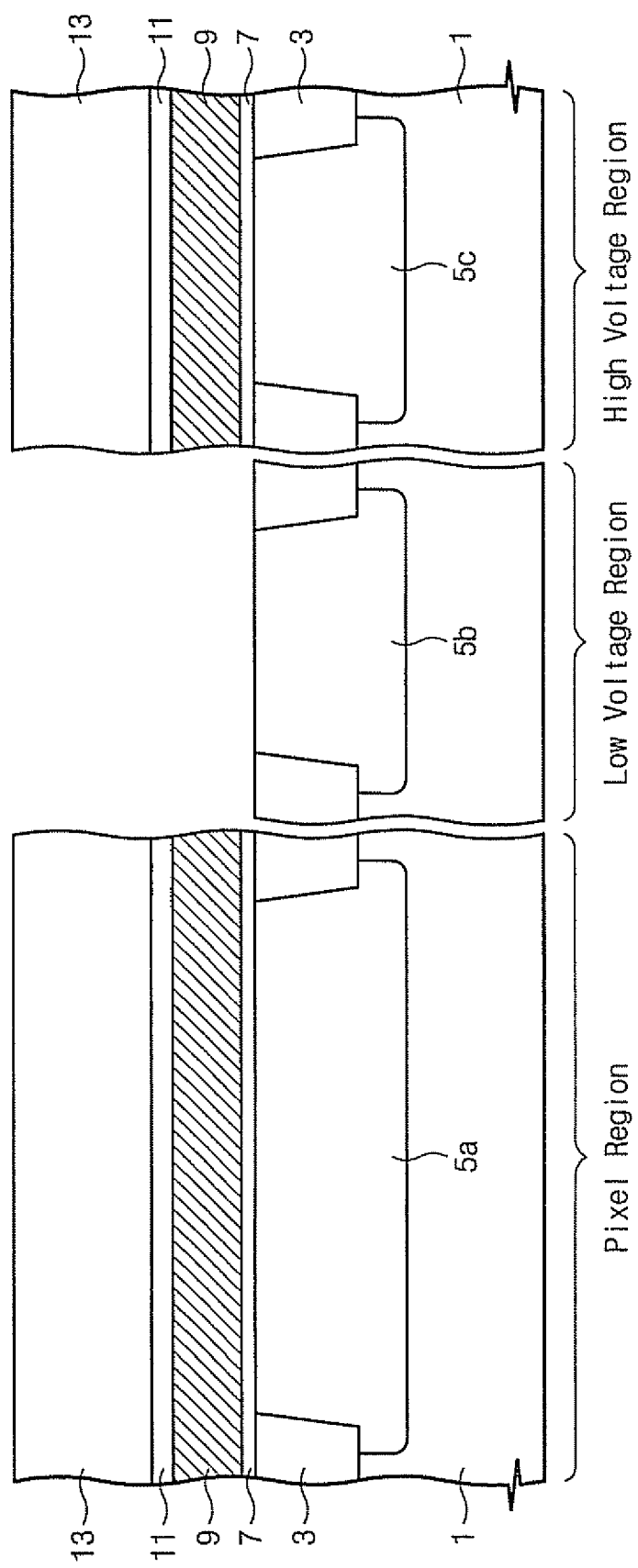

Reference is made to FIG. 4, which is the sectional view of FIG. 3, further modified under a portion of embodiments of methods disclosed herein. A photoresist pattern 13 is formed on the planarization layer 11 over the pixel region 5a and the high voltage region 5c. The photoresist pattern 13 provides an etching mask for the selective removal of the planarization stopping layer 11, the first gate electrode layer 9, and the first gate insulation layer 7. Exposed portions layers are etched away in sequence to expose the low voltage region 5b of the semiconductor substrate 1.

Figure 5:
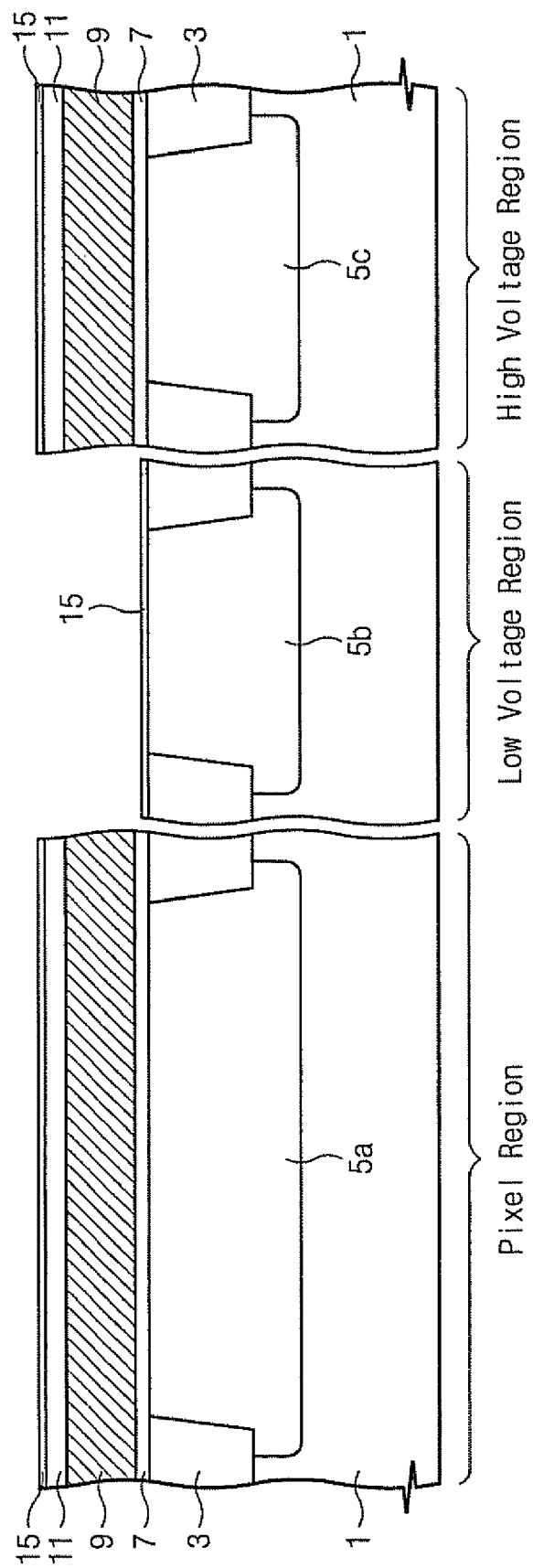

Reference is made to FIG. 5, which is the sectional view of FIG. 4, further modified under a portion of embodiments of methods disclosed herein. The photoresist pattern 13 is removed using, for example, an ashing/striping operation. The removal of the photoresist pattern 13 exposes the planarization stopping layer 11. A cleaning operation is performed on the semiconductor substrate 1 to remove by-products, which may be generated during the preceding etching operation. Thereafter, a second gate insulation layer 15 is deposited over an entire surface of the semiconductor substrate 1 in a nitrogen enhanced atmosphere. In some embodiments, the second gate insulation layer 15 can be formed of a single layer with silicon oxynitride in an approximate thickness of 17□. In some embodiments the second gate insulation layer 15 can be a silicon oxide layer formed on the substrate using thermal oxidation, and then a thermal operation is performed in a nitrogen enhanced atmosphere. The nitrogen enhanced atmosphere can include, for example, nitrogen monoxide (NO) or/and nitrous oxide ($N_2O$). The low voltage region 5b in the semiconductor substrate 1 is exposed to the nitrogen enhanced atmosphere. The pixel and high voltage regions, 5a and 5c, respectively, are not exposed to the nitrogen enhanced atmosphere because they are covered by the planarization stopping layer 11 and the first gate electrode layer 9. In this manner penetration of the nitrogen monoxide (NO) or/and the nitrous oxide ($N_2O$) into the first gate insulation layer 7 may be reduced. In this manner, the first gate insulation layer 7 may remain a pure silicon oxide. The second gate insulation layer 15 can be formed, for example, of a dual layer with silicon oxide and silicon nitride.

Figure 6:
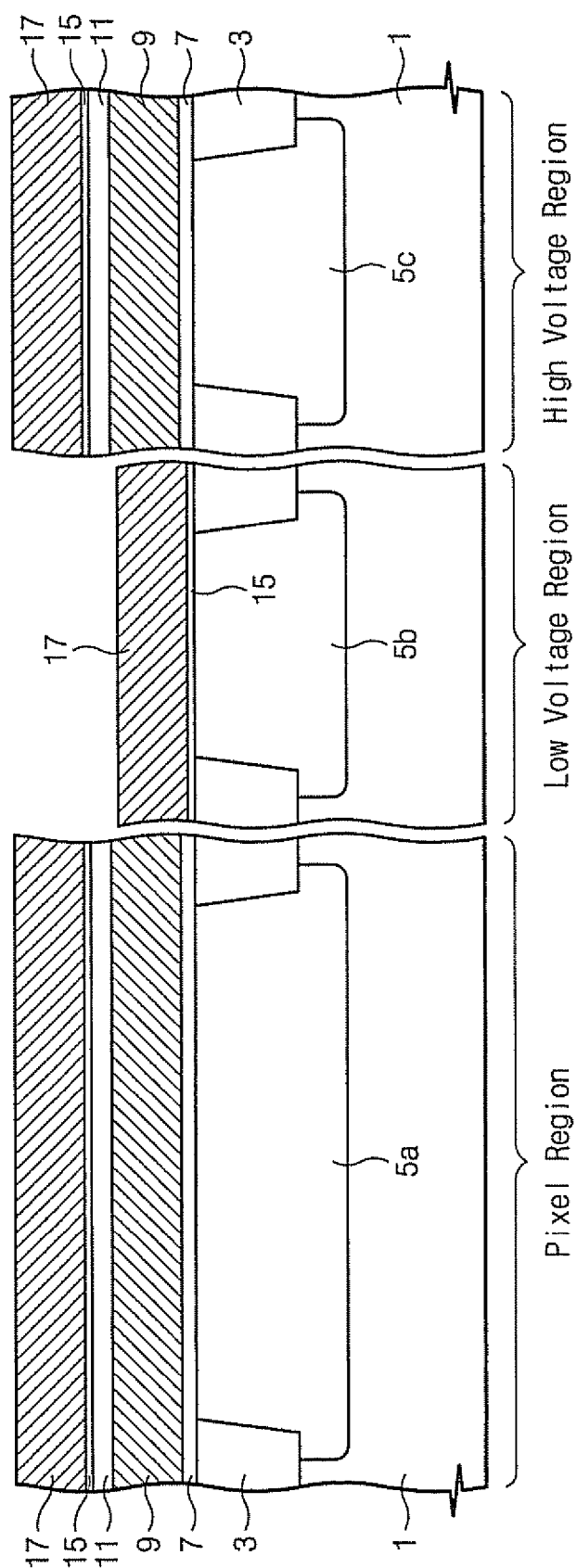

Reference is made to FIG. 6, which is the sectional view of FIG. 5, further modified under a portion of embodiments of methods disclosed herein. A second gate electrode layer 17 is deposited over an entire surface of the semiconductor substrate 1 including the second gate insulation layer 15. The second gate electrode layer 17 can be formed of polysilicon that is doped or undoped with impurities, tungsten silicide, tungsten nitride, or/and tungsten. In some embodiments, the second gate electrode layer 17 can be formed using CVD, for example.

Figure 7:
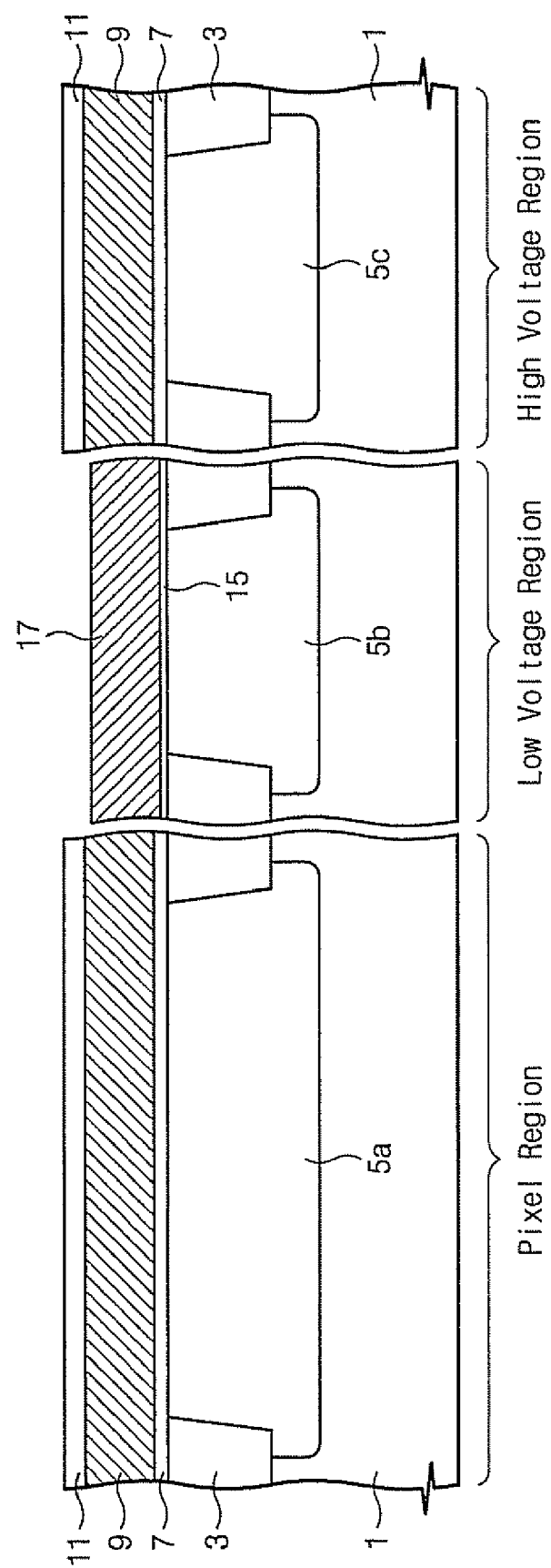

Reference is made to FIG. 7, which is the sectional view of FIG. 6, further modified under a portion of embodiments of methods disclosed herein. The CMP operation can be performed to flatten the second gate electrode layer 17. In this manner, the second gate electrode layer 17 is removed from the planarization stopping layer 11 that is present over the pixel region 5a and the high voltage region 5c, thereby exposing the planarization stopping layer 11 corresponding to these regions.

Figure 8:
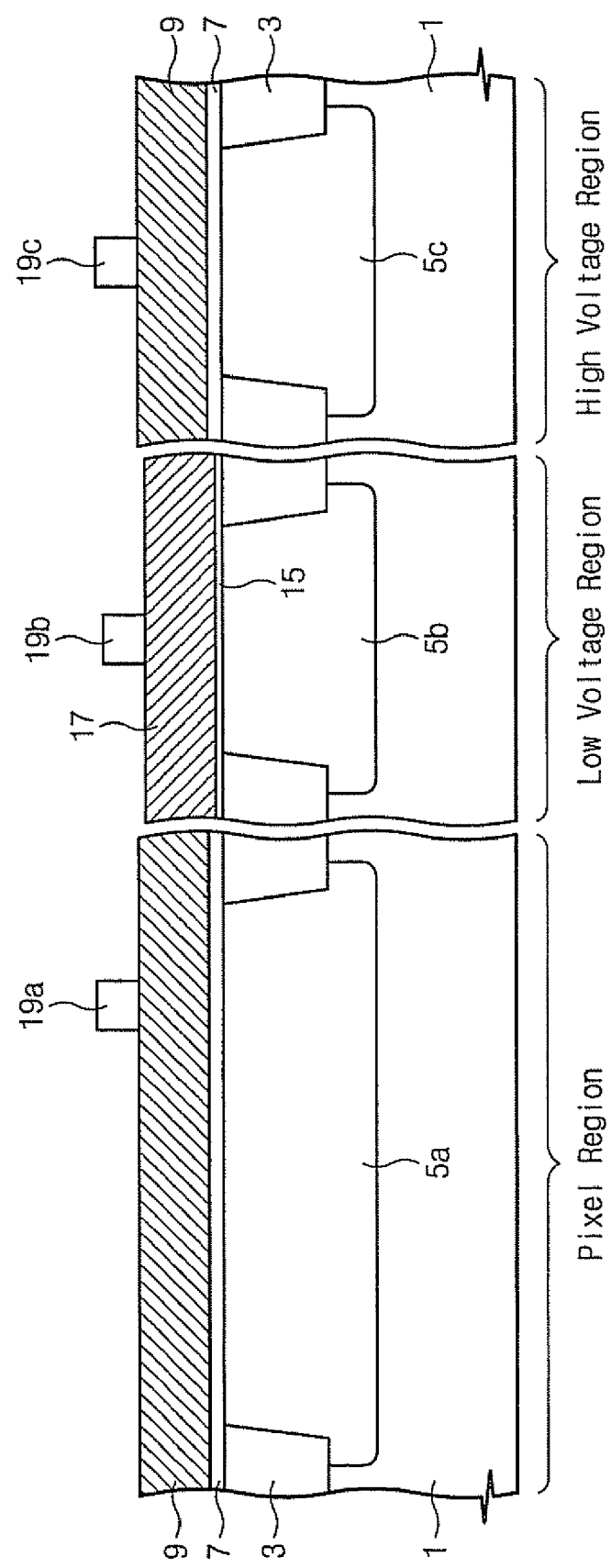

Reference is made to FIG. 8, which is the sectional view of FIG. 7, further modified under a portion of embodiments of methods disclosed herein. The planarization stopping layer 11 is removed using, for example, a wet etching operation, to expose the first gate electrode layer 9. In the pixel, low voltage, and high voltage regions 5a, 5b, and 5c, mask patterns 19a, 19b, and 19c are arranged on the first and second electrode layers 9 and 17. In this manner the gate electrodes are defined. Prior to forming the mask patterns 19a, 19b, and 19c, impurities of the N-type and/or P-type can be implanted first and second gate electrode layers 9 and 17 using, for example, photoresist patterns (not shown). The mask patterns 19a, 19b, and 19c can function as an etching mask or as reflection protecting and capping layers. The mask patterns 19a, 19b, and 19c can be formed of silicon nitride or silicon oxynitride, among others. The mask patterns 19a, 19b, and 19c are divided into the first, second, and third mask patterns. The first, second, and third mask patterns, 19a, 19b, and 19c, respectively, are completed by forming a mask layer over the entire substrate surface and then selectively etching the mask layer under photoresist patterns (not shown).

Figure 9:
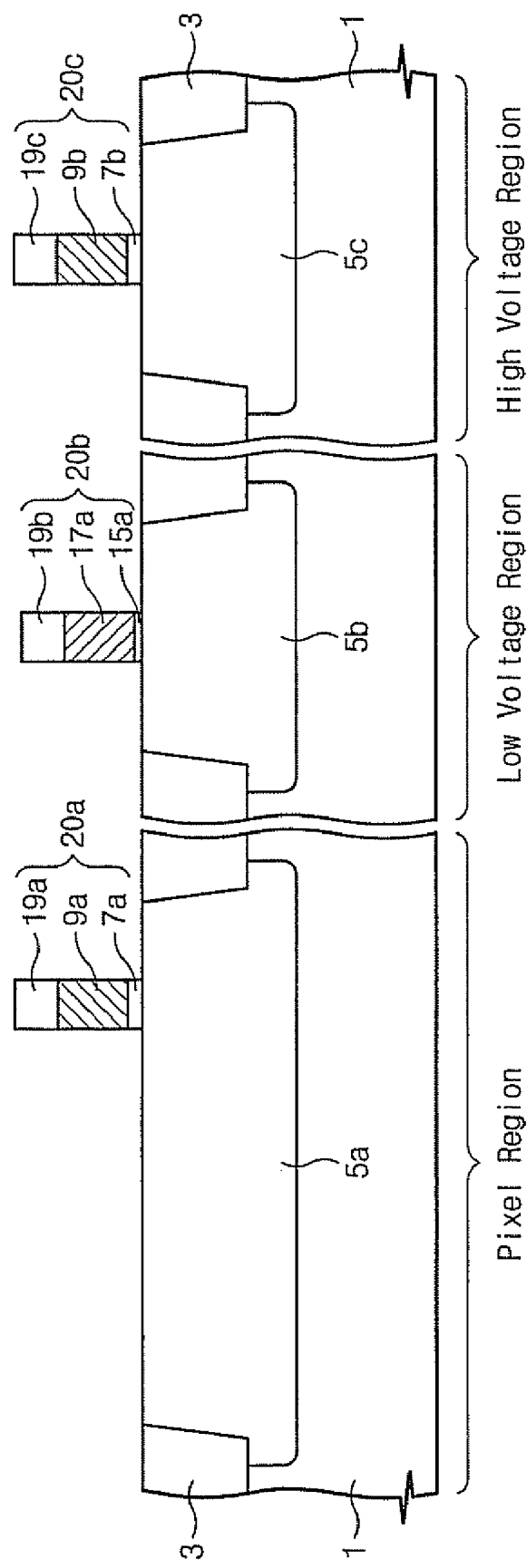

Reference is made to FIG. 9, which is the sectional view of FIG. 8, further modified under a portion of embodiments of methods disclosed herein. Using the mask patterns 19a, 19b, and 19c as an etching mask, the first gate electrode and insulation layers, 9 and 7, are sequentially etched along with the second gate electrode layer 17 and the second gate insulation layer 15. In this manner, the pixel region 5a includes a first gate pattern 20a of the first gate insulation pattern 7a, the first gate electrode 9a, and the first mask pattern 19a. Additionally, the low voltage region 5b includes a second gate pattern 20b of the second gate insulation pattern 15a, the second gate electrode 17a, and the second mask pattern 19b. Further, the high voltage region 5c includes a third gate pattern 20c of the third gate insulation pattern 7b, the third gate electrode 9b, and the third mask pattern 19c.

The first gate pattern 20a can be, for example, a gate of a transfer, reset, selection, or source follower transistor in a unit pixel of an image sensor. The second gate pattern 20b acts as a gate of a transistor operable at a low voltage and the third gate pattern 20c acts as a gate of a transistor operable at a high voltage. The first gate insulation pattern 7a of the first gate pattern 20a in the pixel region 5a is thicker than the second gate insulation pattern 15a of the second gate pattern 20b that corresponds to the low voltage region 5b. Similarly, the third gate insulation pattern 7b of the third gate pattern 20c of the high voltage region 5c is thicker than the second gate insulation pattern 15a of the low voltage region 5b. As a result of the greater insulation thicknesses, the transistors of the pixel region 5a are operable at high voltages similar to those applied to the transistors of the high voltage region 5c.

Figure 10:
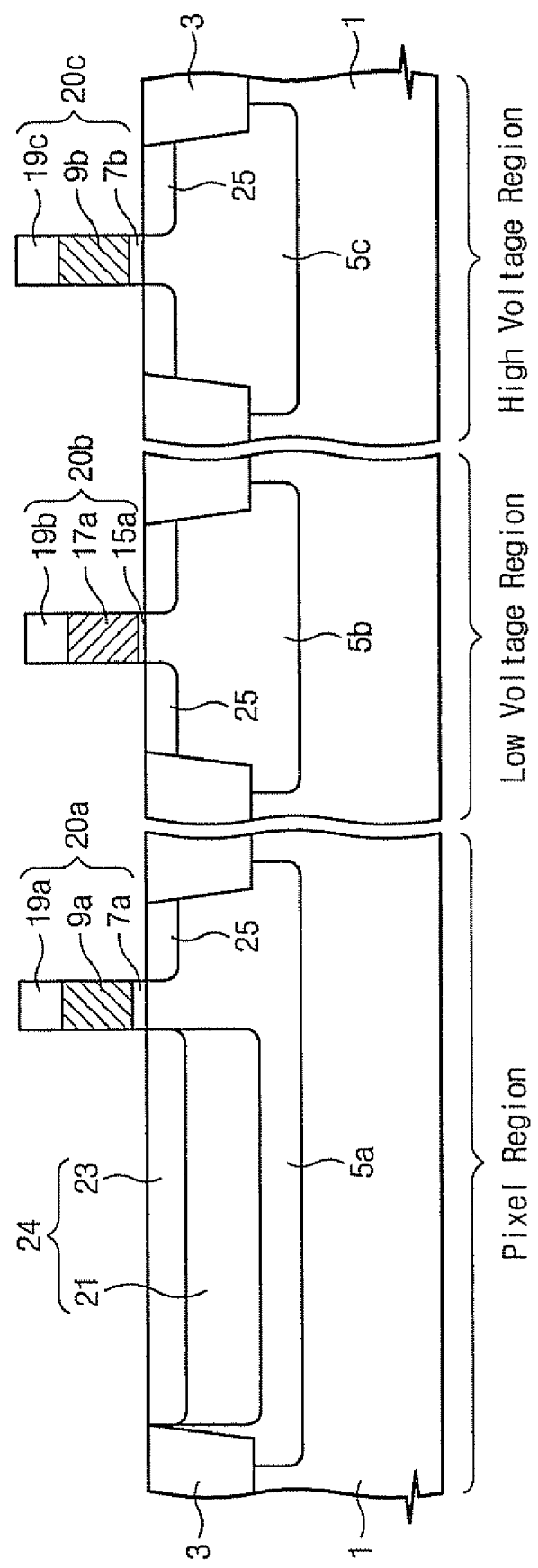

Reference is made to FIG. 10, which is the sectional view of FIG. 9, further modified under a portion of embodiments of methods disclosed herein. A photoelectric converting region (or photodiode region) 24 is formed in the pixel region 5a of the semiconductor substrate 1 at a side of the first gate pattern 20a. The photoelectric converting region 24 is further processed by forming a first photoelectric converting part 23 adjacent the surface of the semiconductor substrate 1 and a second photoelectric converting part 21 deeper than the first photoelectric converting part 23. In some embodiments, the first photoelectric converting part 23 may be N-type that is formed by implanting phosphorous (P) or arsenic (As) therein. The second photoelectric converting part 21 may be P-type, being formed, for example, by implanting boron (B) or boron fluoride therein. Although not shown, gate re-oxidation can be optionally performed for curing etching damages on sidewalls of the gate patterns 20a, 20b, and 20c. Additionally, using the gate patterns 20a, 20b, and 20c and a photoresist pattern (not shown) as an ion implantation mask, source/drain regions 25 are formed in the semiconductor substrate 1 at sides of the gate patterns 20a, 20b, and 20c. Further, although not shown, spacers can be formed on sidewalls of the gate patterns 20a, 20b, and 20c. In this manner, the image sensor can operate without image defects such as flicker noise.

Figure 11:
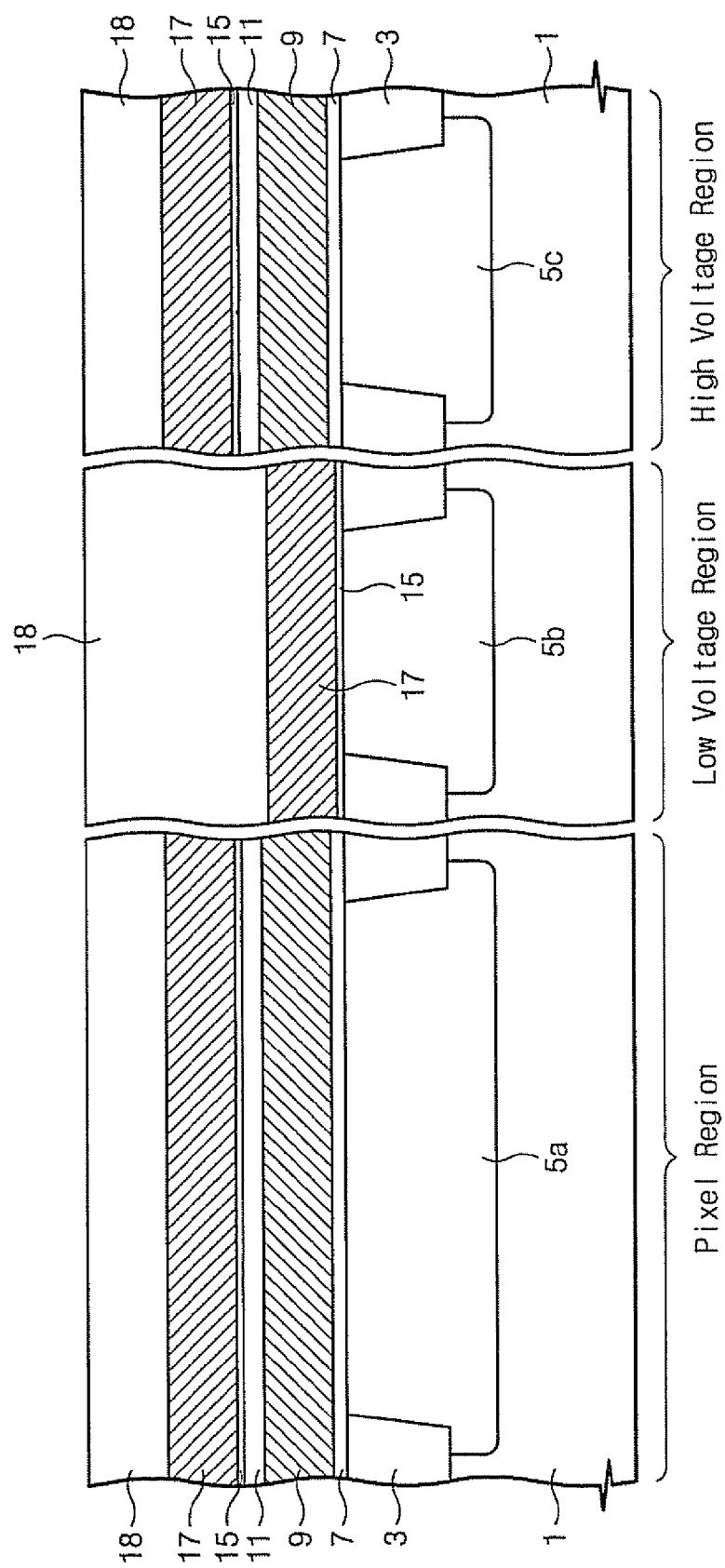
FIGS. 11 and 12 are the sectional views of the semiconductor of FIG. 5 further modified to illustrate an alternative to the process discussed regarding FIGS. 6 and 7.
Figure 12:
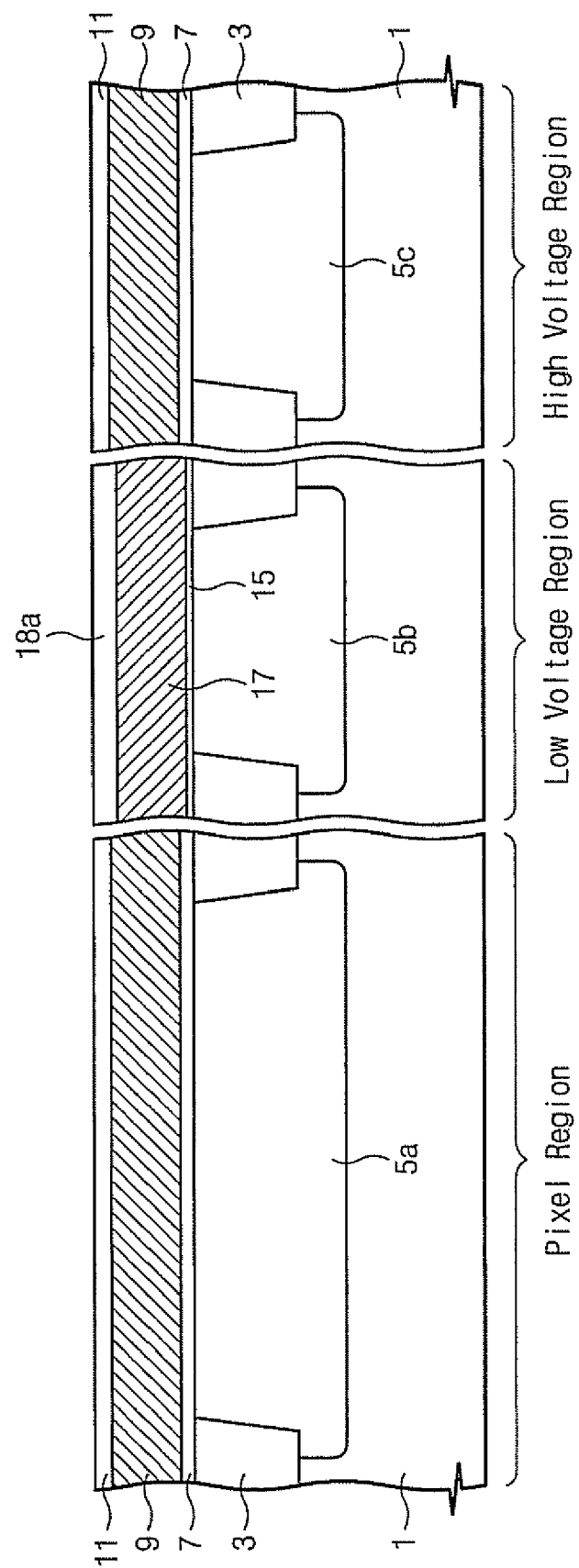

In reference to the above discussion regarding FIGS. 6 and 7, a dishing effect can occur due to the step difference between the pixel, low-voltage, and high voltage regions 5a, 5b, and 5c when a CMP operation is performed on the second gate electrode layer 17. In this regard, reference is now made to FIGS. 11 and 12, which are sectional views of a semiconductor that illustrate exemplary embodiments of processing features for reducing the dishing effect. Reducing the dishing effect can be addressed by forming a sacrificial layer 18 of hydro-silsesquioxane (HSQ), as a series of silicon oxide. The sacrificial layer can be formed using, for example, a spin-on-glass (SOG) technique to render a flattened surface. A polishing process, as illustrated by the sectional view of FIG. 12, is then performed to remove the sacrificial layer 18 from the second gate electrode layer 17 in the pixel and high voltage regions 5a and 5c, which exposes the second gate electrode layer 17 in these regions. The sacrificial layer 18 remains on the second gate electrode layer 17 by the step difference between the low voltage region 5b and the pixel and high voltage regions 5a and 5c. A second polishing process is carried out on the second gate electrode layer 17, which removes the second gate electrode layer 17 from the planarization stopping layer 15 in the pixel and high voltage regions 5a and 5c, which exposes the planarization stopping layer 15. A remnant sacrificial layer 18a may be present in the low voltage region.

Subsequently, the planarization stopping layer 11 and the remnant sacrificial layer 18a are removed by a wet etching process, exposing the first and second gate insulation layers 9 and 17. Thereafter, the gate patterns 20a, 20b, and 20c, the photoelectric converting region 24, and the source/drain regions 25 are formed as shown in FIGS. 8 through 10.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating an image sensor, the method comprising:

forming a first gate insulation layer in a first region of a semiconductor substrate and a first gate electrode layer, to cover the first gate insulation layer, the first region comprising a pixel region and a high voltage region;

forming a second gate insulation layer within a nitrogen enhanced atmosphere and a second gate electrode layer in a second region of the semiconductor substrate;

patterning the first gate electrode layer and the first gate insulation layer of the first region to form a first gate pattern that comprises a pixel region gate pattern in the pixel region and a high voltage region gate pattern in the high voltage region;

patterning the second gate electrode layer and the second gate insulation layer of the second region to form a second gate pattern; and forming a photoelectric converting region in the pixel region at a first side of the pixel region gate pattern, wherein forming the second gate insulation layer comprises exposing a low voltage region that corresponds to the second region to the nitrogen enhanced atmosphere without exposing the first gate insulation layer in the high voltage region and the pixel region that correspond to the first region to the nitrogen enhanced atmosphere.

2. The method of claim 1, wherein the first gate insulation layer comprises silicon oxide ($SiO_2$).

3. The method of claim 1, wherein the second gate insulation layer comprises a single layer of silicon oxynitride (SiON).

4. The method of claim 1, wherein the second gate insulation layer comprises a first layer of silicon nitride and a second layer of silicon oxide.

5. The method of claim 1, wherein forming the second gate insulation layer comprises:

forming an oxide layer on the semiconductor substrate; and performing a thermal process to the oxide layer within the nitrogen enhanced atmosphere.

6. The method of claim 1, wherein the nitrogen enhanced atmosphere comprises at least one gas selected from the group consisting of nitrogen monoxide (NO) and nitrous oxide (N2O).

7. A method of fabricating an image sensor, the method comprising:

forming a first gate insulation layer in a first region of a semiconductor substrate and a first gate electrode layer, to cover the first gate insulation layer, the first region comprising a pixel region and a high voltage region;

forming a second gate insulation layer within a nitrogen enhanced atmosphere and a second gate electrode layer in a second region of the semiconductor substrate;

patterning the first gate electrode layer and the first gate insulation layer of the first region to form a first gate pattern that comprises a pixel region gate pattern in the pixel region and a high voltage region gate pattern in the high voltage region;

patterning the second gate electrode layer and the second gate insulation layer of the second region to form a second gate pattern; and forming a photoelectric converting region in the pixel region at a first side of the pixel region gate pattern, wherein forming the first gate insulation layer and the first gate electrode layer in the first region of the semiconductor substrate and forming the second gate insulation layer and the second gate electrode layer in the second region of the semiconductor substrate comprises:

forming the first gate insulation layer and the first gate electrode layer over an entire surface of the semiconductor substrate;

removing the first gate electrode layer and the first gate insulation layer from the second region to expose a surface of the semiconductor substrate of the second region; and forming the second gate insulation layer and the second gate electrode layer on the exposed surface of the semiconductor substrate of the second region.

8. The method of claim 7, further comprising forming a planarization stopping layer on the first gate electrode layer.

9. The method of claim 8, wherein removing the second gate electrode layer and the second gate insulation layer from the first region is carried out by performing a chemical-mechanical polishing process to disclose the planarization stopping layer.

10. The method of claim 9, further comprising forming a sacrificial layer on the second gate electrode layer before removing the second gate electrode layer and the second gate insulation layer in the first region, wherein the sacrificial layer is removed while removing the second gate electrode layer and the second gate insulation layer from the first region.

11. The method of claim 10, wherein the polishing process comprises:

a first polishing process that removes at least a portion of the sacrificial layer from the second gate electrode layer and exposes the second gate electrode layer; and a second polishing process that removes at least a portion of the second gate insulation layer, the second gate electrode layers, and the sacrificial layer on the planarization stopping layer and exposes the planarization stopping layer.

12. A method of fabricating an image sensor, comprising:

covering a first gate insulation layer, in a pixel region and a high voltage region of a semiconductor substrate, with a first gate electrode layer;

patterning the first gate electrode layer and the first gate insulation layer to form a pixel region gate pattern in the pixel region and a high voltage region gate pattern in the high voltage region;

forming a second gate electrode layer in a low voltage region of the semiconductor substrate;

forming a second gate insulation layer within a nitrogen enhanced atmosphere in the low voltage region of the semiconductor substrate; and forming a photoelectric converting region in the pixel region of the semiconductor substrate at a side of the pixel region gate pattern, wherein forming the second gate insulation layer comprises exposing the low voltage region to the nitrogen enhanced atmosphere without exposing the first gate insulation layer in the high voltage region and the pixel region to the nitrogen enhanced atmosphere.

13. The method of claim 12, wherein the first gate insulation layer comprises silicon oxide ($SiO_2$).

14. The method of claim 13, wherein the second gate insulation layer comprises a single layer of silicon oxynitride (SiON).

15. The method of claim 13, wherein the second gate insulation layer comprises a first layer of silicon nitride and a second layer of silicon oxide.

16. The method of claim 12, wherein forming the second gate insulation layer comprises:

forming an oxide layer on the semiconductor substrate; and performing a thermal process to the oxide layer in the nitrogen enhanced atmosphere.

17. The method of claim 12, wherein the nitrogen enhanced atmosphere comprises at least one gas selected from the group consisting of nitrogen monoxide (NO) and nitrous oxide (N2O).

18. The method of claim 12, wherein covering the first gate insulation layer with the first gate electrode layer in the pixel and high voltage regions of the semiconductor substrate, forming the second gate electrode layer in the low voltage region of the semiconductor substrate, and forming the second gate insulation layer within the nitrogen enhanced atmosphere in the low voltage region of the semiconductor substrate comprises:

- forming the first gate insulation layer and the first gate electrode layer over an entire surface of the semiconductor substrate;
- removing the first gate electrode layer and the first gate insulation layer from the low voltage region to expose a surface of the semiconductor substrate of the second region; and
- forming the second gate insulation layer and the second gate electrode layer on the exposed surface of the semiconductor substrate of the second region.

19. The method of claim 18, further comprising forming a planarization stopping layer on the first gate electrode layer.

20. The method of claim 19, wherein removing the second gate electrode layer and the second gate insulation layer from the pixel and high voltage regions comprises performing a chemical-mechanical polishing process to expose the planarization stopping layer.

21. The method of claim 20, further comprising forming a sacrificial layer on the second gate electrode layer before removing the second gate electrode layer and the second gate insulation layer in the pixel and high voltage regions, wherein the sacrificial layer is removed while removing the second gate electrode layer and the second gate insulation layer from the pixel and high voltage regions.

22. The method of claim 21, wherein the polishing process comprises:

- a first polishing process that removes at least a portion of the sacrificial layer from the second gate electrode layer and exposes the second gate electrode layer; and
- a second polishing process that removes at least a portion of the second gate insulation layer, the second gate electrode layers, and the sacrificial layer on the planarization stopping layer and exposes the planarization stopping layer.

* * * * *